US008706049B2

(12) United States Patent
Choudhury et al.

(10) Patent No.: US 8,706,049 B2
(45) Date of Patent: Apr. 22, 2014

(54) PLATFORM INTEGRATED PHASED ARRAY TRANSMIT/RECEIVE MODULE

(75) Inventors: Debabani Choudhury, Thousand Oaks, CA (US); Richard S. Perry, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 595 days.

(21) Appl. No.: 12/347,316

(22) Filed: Dec. 31, 2008

(65) Prior Publication Data
US 2010/0164783 A1 Jul. 1, 2010

(51) Int. Cl.
*H04B 1/38* (2006.01)

(52) U.S. Cl.
USPC ............................................ 455/73; 342/368

(58) Field of Classification Search
USPC ............... 455/73; 342/368, 371, 372, 377
See application file for complete search history.

(56) References Cited

U.S. PATENT DOCUMENTS

| 4,967,201 | A | | 10/1990 | Rich, III |
| 5,262,794 | A | * | 11/1993 | Hegazi et al. ............ 343/770 |
| 5,846,204 | A | * | 12/1998 | Solomon ................. 600/463 |
| 6,154,176 | A | | 11/2000 | Fathy et al. |
| 6,512,431 | B2 | | 1/2003 | Pergande |
| 6,535,168 | B1 | | 3/2003 | Marumoto et al. |
| 6,690,324 | B2 | * | 2/2004 | Vail et al. ................. 342/372 |
| 6,713,854 | B1 | * | 3/2004 | Kledzik et al. ........... 257/686 |
| 6,885,561 | B1 | | 4/2005 | Hashemi et al. |
| 7,830,312 | B2 | | 11/2010 | Choudhury et al. |
| 7,852,281 | B2 | | 12/2010 | Choudhury |

| 2002/0131237 | A1 | | 9/2002 | Snyder et al. |
| 2003/0043071 | A1 | * | 3/2003 | Lilly et al. ................ 342/368 |
| 2003/0150641 | A1 | | 8/2003 | Kinayman et al. |
| 2003/0174479 | A1 | | 9/2003 | Shimura et al. |
| 2004/0056803 | A1 | | 3/2004 | Soutiaguine et al. |
| 2005/0047094 | A1 | * | 3/2005 | Hsu et al. ................. 361/704 |
| 2005/0190017 | A1 | | 9/2005 | Hirabayashi |
| 2006/0164308 | A1 | | 7/2006 | Cohen |

(Continued)

FOREIGN PATENT DOCUMENTS

| CN | 1507767 A | 6/2004 |
| EP | 1069639 A2 | 1/2001 |

(Continued)

OTHER PUBLICATIONS

International Search Report and Written Opinion received for PCT Patent Application No. PCT/US2009/069516, mailed on Aug. 16, 2010, 8 pages.

(Continued)

*Primary Examiner* — Lincoln Donovan
*Assistant Examiner* — Diana J Cheng
(74) *Attorney, Agent, or Firm* — Sutherland Asbill & Brennan LLP

(57) ABSTRACT

Disclosed are integration approaches for mm-wave planar phased array type architectures using multilayer substrate technologies. For instance, an apparatus may include a plurality of substrate layers, an integrated circuit, and a connector module. The plurality of substrate layers includes a first substrate layer having one or more phased array elements. The integrated circuit exchange one or more radio frequency (RF) signals (e.g., mm-wave signals) with the one or more phased array elements. The connector module exchange further signals with the integrated circuit that correspond to the one or more RF signals. For example, these further signals may be baseband or intermediate frequency (IF) signals.

16 Claims, 4 Drawing Sheets

(56) References Cited

U.S. PATENT DOCUMENTS

| | | | |
|---|---|---|---|
| 2007/0217175 | A1 | 9/2007 | Young et al. |
| 2008/0277778 | A1* | 11/2008 | Furman et al. ............... 257/713 |
| 2010/0164783 | A1 | 7/2010 | Choudhury et al. |
| 2010/0167666 | A1 | 7/2010 | Choudhury et al. |

FOREIGN PATENT DOCUMENTS

| | | | |
|---|---|---|---|
| EP | 1069639 A3 | 5/2002 | |
| EP | 1326303 A2 | 7/2003 | |
| EP | 1326303 A3 | 5/2004 | |
| JP | 2000-100835 A | 4/2000 | |
| JP | 2000-196331 A | 7/2000 | |
| JP | 2001-267842 A | 9/2001 | |
| JP | 2002-278856 A | 9/2002 | |
| JP | 2003-204211 A | 7/2003 | |
| JP | 2004-080159 A | 3/2004 | |
| JP | 2005-019882 A | 1/2005 | |
| JP | 2005-117139 A | 4/2005 | |
| JP | 2005-315747 A | 11/2005 | |
| JP | 2006-500821 A | 1/2006 | |
| JP | 2007-068037 A | 3/2007 | |
| JP | 2007-306304 A | 11/2007 | |
| KR | 10-2006-0048432 A | 5/2006 | |
| WO | 02/065578 A2 | 8/2002 | |
| WO | 02/065578 A3 | 10/2002 | |
| WO | 2005/107014 A1 | 11/2005 | |
| WO | 2010/078199 A2 | 7/2010 | |
| WO | 2010/078215 A2 | 7/2010 | |
| WO | 2010/078199 A3 | 10/2010 | |
| WO | 2010/078215 A3 | 10/2010 | |

OTHER PUBLICATIONS

International Preliminary Report on Patentability received for PCT Patent Application No. PCT/US2009/069516, mailed on Jul. 14, 2011, 5 pages.

Office Action received for U.S. Appl. No. 12/347,915, mailed on Aug. 2, 2012, 10 pages.

Office Action received for U.S. Appl. No. 12/347,915, mailed on Aug. 17, 2011, 4 pages.

Office Action received for U.S. Appl. No. 12/347,915, mailed on Jan. 31, 2012, 14 pages.

Office Action received for U.S. Appl. No. 12/347,915, mailed on Mar. 29, 2012, 12 pages.

Office Action received for Chinese Patent Application No. 200911000101.4, mailed on Jun. 15, 2012, 6 pages of English Translation and 6 pages of Chinese Office Action.

Choudhury, Debabani, "Sectorized, Millimeter-Wave Antenna Arrays With Optimizable Beam Coverage for Wireless Network Applications", U.S. Appl. No. 12/135,631, filed Jun. 9, 2008, 15 pages.

Gaucher, et al., "MM-Wave Transceivers Using SiGe HBT Technology", 2004 Topical Meeting on Silicon Monolithic Integrated Circuits in RF Systems, IEEE, pp. 81-84.

Lee, et al., "A Highly Integrated 3-D Millimeter-Wave Filter Using LTCC System-on-Package (SOP) Technology for V-band WLAN Gigabit Wireless Systems", APMC 2005 Proceedings, Dec. 4-7, 2005, 3 pages.

International Preliminary Report on Patentability received for PCT Patent Application No. PCT/US2009/069442, mailed on Jul. 14, 2011, 5 pages.

International Search Report and Written Opinion received for PCT Patent Application No. PCT/US2009/069442, mailed on Aug. 16, 2010, 8 pages.

Tentzeris, et al., "3-D-Integrated RF and Millimeter-Wave Functions and Modules Using Liquid Crystal Polymer (LCP) System-on-Package Technology", IEEE trans. on Advanced packaging, vol. 27, No. 2, May 2004, pp. 332-340.

Office Action received for Chinese Patent Application No. 200911000046.9, mailed on Nov. 2, 2012, 4 pages of English Translation, 2 pages of Search Report and 6 pages of Chinese Office Action.

Office Action received for European Patent Application No. 09837055.4, mailed on Aug. 30, 2011, 2 pages.

Office Action received for Korean Patent Application No. 10-2011-7015107, mailed on Oct. 10, 2012, 3 pages of English Translation only.

Office Action received for Taiwan Patent Application No. 98145017, mailed on Nov. 1, 2012, 1 page of Search Report and 7 pages of Taiwan Office Action.

Office Action received for European Patent Application No. 09837046.3, mailed on Aug. 25, 2011, 2 pages.

Office Action received for Korean Patent Application No. 10-2011-7015028, mailed on Oct. 10, 2012, 3 pages of English Translation only.

Office Action received for Japanese Patent Application No. 2011-544548, mailed on Mar. 19, 2013, 3 pages of English translation and 3 pages of Office Action.

Office Action received for Korean Patent Application No. 2011-7015107, mailed on Apr. 8, 2013, 5 pages of English Translation only.

Office Action received for Chinese Patent Application No. 200911000046.9, mailed on Jun. 24, 2013, 11 pages of office action including 7 pages of English Translation.

Office Action received for Chinese Patent Application No. 200911000101.4, mailed on Jan. 21, 2013, 7 pages of office action including 3 pages of English Translation.

Office Action received for Japanese Patent Application No. 2011-544515, mailed on Feb. 5, 2013, 6 pages of office action including 3 pages of English Translation.

Extended European Search Report received for European Patent Application No. 09837055.4, mailed on Jan. 14, 2014, 6 pages.

Office Action received for Taiwanese Patent Application No. 98145020, mailed on Nov. 21, 2013, 12 pages of Office Action including 4 pages of English Translation.

* cited by examiner

PLATFORM INTEGRATED PHASED ARRAY TRANSMIT/RECEIVE MODULE

BACKGROUND

Technological developments permit digitization and compression of large amounts of voice, video, imaging, and data information. The need to transfer data between devices through wireless techniques requires the exchange of accurate data streams at high data rates.

An extremely high frequency (EHF) electromagnetic energy band with wavelengths between approximately 1 millimeter and 10 millimeters may be used to transfer large amounts of data wirelessly. The EHF band includes a 60 gigahertz (GHz) segment (or band) that is between 56 and 66 gigahertz (GHz). This band may be used for high data rate millimeter-wave (mm-wave) communications.

BRIEF DESCRIPTION OF THE DRAWINGS

In the drawings, like reference numbers generally indicate identical, functionally similar, and/or structurally similar elements. The drawing in which an element first appears is indicated by the leftmost digit(s) in the reference number. The present invention will be described with reference to the accompanying drawings, wherein.

DETAILED DESCRIPTION

Figure 1:
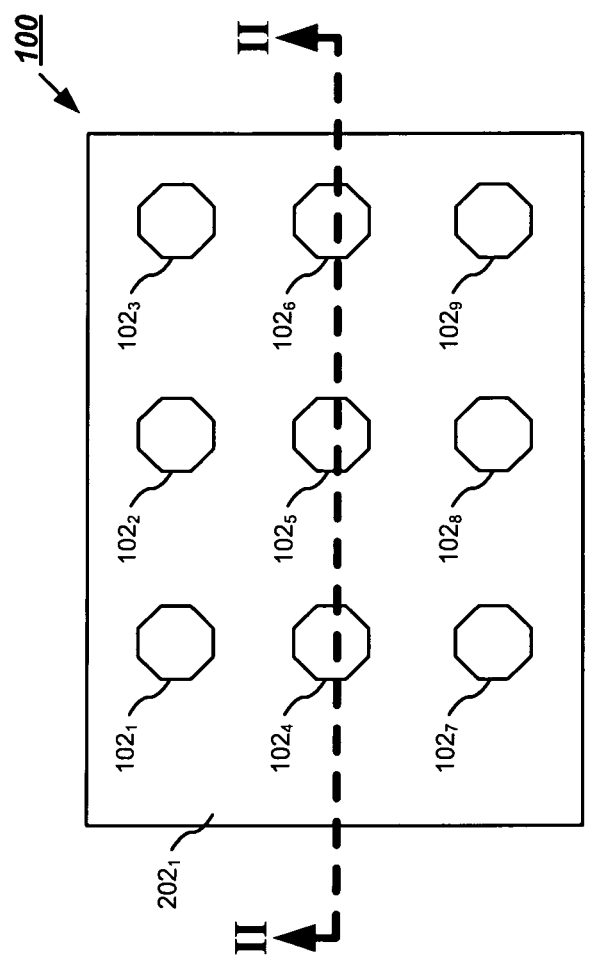
FIG. 1 is a top view of a phased array transmit and receive (T/R) module showing planar antenna element structures.

Embodiments provide a low-cost, integration approach for mm-wave planar phased array type architectures using multilayer substrate technologies. For instance, embodiments may provide an apparatus having a plurality of substrate layers, an integrated circuit, and a connector module. The plurality of substrate layers includes a first substrate layer having one or more phased array antenna elements. The integrated circuit exchanges one or more mm-wave signals with the one or more phased array elements. The connector module exchanges one or more further signals with the integrated circuit that correspond to the one or more mm-wave signals. For example, these further signals may be baseband or intermediate frequency (IF) signals. The downconverted IF signals can be at RF frequencies.

Through the employment of such techniques, compact and easy to assemble, yet low cost millimeter wave wireless devices may be provided. Such devices may operate local area network (WLAN), wireless personal area network (WPAN), HDMI-type usage models, requiring high-data-rate transfer. For such applications, millimeter-wave communication using extremely high frequency radio signals is desirable because it provides relatively high communications throughput while allowing for high frequency reuse potential.

Existing millimeter wave communications techniques and systems employing coplanar waveguides and/or unshielded transmission structures fail to provide a compact yet low cost solution for communication devices using EHF radio signals. Unshielded transmission lines demonstrate quasi-transverse electromagnetic characteristics and suffer performance degradation when placed in close proximity to other structures in a compact packaging scenario. High performance waveguide structures, including plastic-based metallized structures, have been proposed for compact packaging. However, use of waveguides result in bulky structures in most designs.

Antennas designed to communicate using EHF radio signals with small wavelengths may be designed using small form factor packages due to small antenna profiles, allowing for a compact antenna array architecture. Embodiments provide a low cost and compact antenna array capable of operating using mm-wave frequency radio signals, for example an unlicensed short range frequency band with data throughputs up to 5-10 gigabit per second. This may advantageously enable more efficient form factor design of access point or consumer electronic and handheld devices while providing increased operability in a variety of applications. As a result, bulky antenna array systems inherent to existing antenna types are avoided. Access points or devices employing extremely high frequency radio signals in a high bandwidth wireless communication environment may enjoy multidirectional wireless coverage from a low-cost, yet compact antenna array system.

Embodiments provide 60 GHz band (e.g., 56-66 GHz) millimeter-wave (mm-wave) communications devices that may be used in a variety of applications. Accordingly, embodiments may be used in conjunction with various devices and systems. Exemplary devices and systems include a transmitter, a receiver, a transceiver, a wireless communication station, a wireless communication device, a wireless Access Point (AP), a modem, a wireless modem, a Personal Computer (PC), a desktop computer, a mobile computer, a laptop computer, a notebook computer, a tablet computer, a server computer, a set-top box, a handheld computer, a handheld device, a Personal Digital Assistant (PDA) device, a handheld PDA device, a mobile station (MS), a graphics display, a communication station, and so forth.

Also, embodiments may be used in conjunction with various networks. Exemplary networks include wireless networks, local area networks (LANs), a wireless LANs (WLANs), metropolitan area network (MANs), wireless MANs (WMANs), wide area networks (WANs), and wireless WANs (WWANs).

Additionally, embodiments may be used in conjunction with networks operating in accordance with existing IEEE 802.11, 802.11a, 802.11b, 802.11e, 802.11g, 802.11h, 802.11i, 802.11n, 802.16, 802.16d, 802.16e standards and/or future versions and/or derivatives and/or Long Term Evolution (LTE) of the above standards. Also, embodiments may be used in conjunction with personal area networks (PANs), wireless PANs (WPANs), one way and/or two-way radio communication systems, cellular radio-telephone communication systems.

Further, embodiments of the invention may be used in conjunction with one or more types of wireless communication signals and/or systems, for example, Radio Frequency (RF), Infra Red (IR), Frequency-Division Multiplexing (FDM), Orthogonal FDM (OFDM), Time-Division Multiplexing (TDM), Time-Division Multiple Access (TDMA), Extended TDMA (E-TDMA), General Packet Radio Service (GPRS), Extended GPRS, Code-Division Multiple Access (CDMA), Wideband CDMA (WCDMA), CDMA 2000, Multi-Carrier Modulation (MDM), Discrete Multi-Tone (DMT), Bluetooth®, ZigBee™, and/or the like.

Moreover, embodiments may be employed in devices, such as cellular telephones, wireless telephones, Personal Communication Systems (PCS) devices, PDA devices having wireless communications capabilities, Multiple Input Multiple Output (MIMO) transceiver or devices, Single Input Multiple Output (SIMO) transceivers or devices, Multiple Input Single Output (MISO) transceivers or devices, Multi Receiver Chain (MRC) transceivers or devices, transceivers or devices having "smart antenna" technology or multiple antenna technology, and/or the like.

The foregoing examples are provided for purposes of illustration and not limitation. Accordingly, embodiments may be used in various other apparatuses, devices, systems and/or networks.

Reference throughout this specification to "one embodiment" or "an embodiment" means that a particular feature, structure, or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

FIG. 1 is a top view of a phased array transmit and receive (T/R) module 100. As shown in FIG. 1, T/R module 100 includes multiple array elements $102_1$-$102_9$. These elements are composed of a conductive material that is disposed on a surface of a substrate layer $202_1$. Alternatively, one or more of these array elements may be formed on multiple adjacent layers to create antenna and coupling structures. FIG. 1 shows nine array elements for purposes of illustration, and not limitation. Accordingly, embodiments may employ any number of array elements in various patterns or arrangements.

Figure 2:
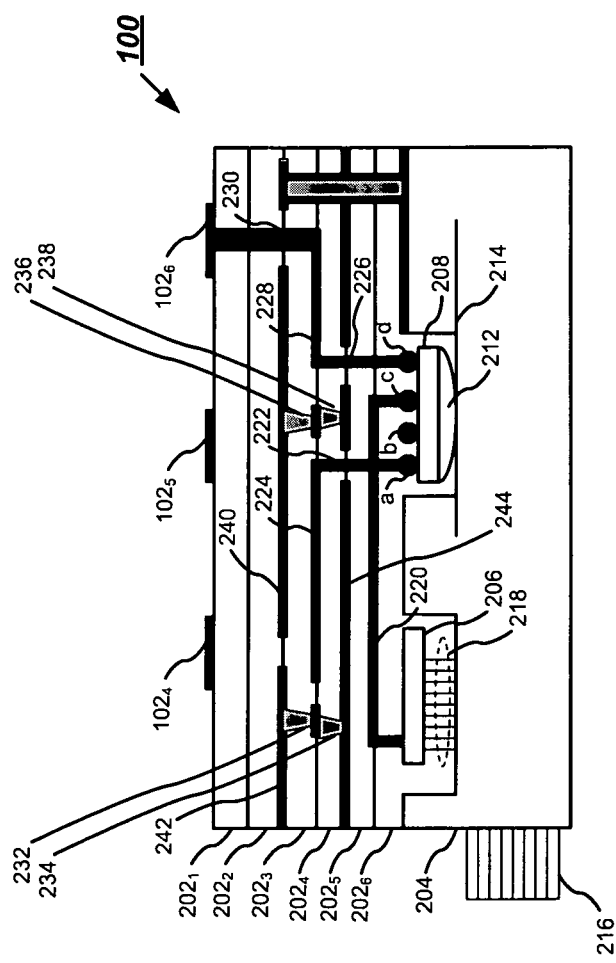
FIG. 2 is a cross-sectional side view of the T/R module shown in FIG. 1.

FIG. 2 is a cross-sectional side view of phased array T/R module 100. This view shows that T/R module 100 includes multiple substrate layers $202_1$-$202_6$. Although six layers are shown, embodiments are not limited to this number of layers. Thus, embodiments may employ any number of layers. In addition, T/R module 100 includes a heat sink portion 204.

In embodiments, each of substrate layers $202_1$-$202_6$ has a thickness that is between approximately 25 and 100 micrometers. In further embodiments, layers $202_1$-$202_6$ are each between 25 and 50 micrometers in thickness. Embodiments, however, are not limited to these exemplary thicknesses.

Substrate layers $202_1$-$202_6$ may be composed of various materials. For example, these layers may be formed from a high frequency material type such as a laminate, ceramic, semi-insulating (SI)-silicon, low-loss-organics such as liquid crystal polymer (LCP), and a Rogers Corporation RO-series material such as an RO-Series High Frequency Circuit Material comprising a woven glass reinforced/ceramic filled thermoset material with a very high glass transition temperature. Generally, materials for substrate layers $202_1$-$202_6$ (or in embodiments, $202_1$-$202_N$, where N designates the number of layers employed) are selected based on physical, electrical, and chemical characteristics such as a thermal expansion coefficient so they may be compatible with one another in mm-wave applications.

Heat sink portion 204 provides for the dissipation of heat generated by elements within phased array T/R module 100. As shown in FIG. 2, recesses are formed within heat sink portion 204 to accommodate an integrated circuit (IC) 208 and a connector module 206. These recesses are adjacent to layer $202_6$.

In embodiments, IC 208 is a mm-wave phased array front-end that amplifies and converts mm-wave signals to and/or from approximately 1-15 GHz frequencies for baseband and digital data. IC 208 may comprise a transceiver having amplifiers, filters, frequency converters and other integrated circuit components. However, IC 208 may provide further additional and/or alternative features.

As shown in FIG. 2, IC 208 includes pads a, b, c and d. These pads, which are composed of a conductive material, each provide for electrical connections with IC 208. Thus, IC 208 exchanges signals via pads a, b, c, and d.

IC 208 may be formed from group III and IV semiconductor technology such as Gallium Arsenide (GaAs) and Indium Phosphide (InP). At mm-wave frequencies, GaAs and InP may provide highly integrated solutions. Alternately, IC 208 may be formed from Silicon Germanium (SiGe) or complimentary metal-oxide semiconductor (CMOS) silicon technology Although FIG. 2 shows a single integrated circuit (IC 208), embodiments may employ a plurality of integrated circuits in phased array T/R module 100.

In addition to exchanging signals wirelessly through elements $102_1$-$102_9$, phased array T/R module 100 may exchange signals with other devices through a flexible cable 216. In embodiments, flexible cable 216 may be a conventional "flex cable" that conveys, RF, analog, digital, DC signals, and/or other types of signals. However, other types of cables may be employed. For instance, embodiments may employ rigid cables or cable assemblies.

As shown in FIG. 2, flexible cable 216 enters into phased array T/R module 100 through an opening (e.g., a channel) in heat sink portion 204. This opening is directed to connector module 206. As shown in FIG. 2, an end 218 of flexible cable 216 connects to connector module 206. Connector module 206 includes integrated socket contacts into which flexible cable 216 may be plugged.

Through the employment of connector module 206, phased array T/R module 100 advantageously avoids the use of printed circuit board (PCB) integration. As a result, size reductions may be achieved. Also, through this feature, phased array T/R module 100 may be directly integrated into platform environments having smaller form-factor requirements. Further, this feature may advantageously provide cost savings over PCB integrated approaches.

FIG. 2 shows that integrated circuit 208 is attached to heat sink portion 204 by a material 212, such as conductive paste, or any other suitable material. Further, a heat spreader material 214 integrated within heat sink portion 204 provides improved heat dissipation from IC 208. More particularly, heat spreader material 214 disperses generated heat in the x- and y-directions so that the heat is not localized in a small area underneath the heat's generator (e.g., IC 208). In embodiments, heat spreader material 214, IC 208, and/or heat sink portion 204 may have similar coefficients of thermal expansion (CTE). This may advantageously ensure reliability of phased-array T/R module 100. Embodiments, however, may employ other heat removing/conducting materials and/or arrangements.

In general operation, phased array T/R module 100 may exchange wireless signals with remote devices. For instance, in the transmission of wireless signals, connector module 206 receives baseband or intermediate frequency (IF) signals, RF signals, ground, and/or DC/power signals from flexible cable 216. In turn, connector module 206 provides such signals to IC 208.

For instance, FIG. 2 shows connector module 206 providing a baseband, IF, or RF signal to pad c of IC 208 through conductive line 220. From this signal, IC 208 generates mm-wave signals at pads a and d. More particularly, IC 208 generates a first mm-wave signal that is sent across a stacked via 226, a conductive pattern 228, and a stacked via 230 to array element $102_6$.

Also, IC 208 generates a second RF signal that is sent across a via 222 to a conductive pattern 224 that is disposed on layer 202$_4$. An opening (e.g., a slot) between conductive patterns 240 and 242 on substrate layer 202$_3$ provides a coupling for this RF signal to array element 102$_4$.

Conversely, elements 102$_1$-102$_9$ (or in embodiments, elements 102$_1$-102$_M$, where M designates the number of elements employed) may receive mm-wave wireless signals and provide them to IC 208 along the same routes. In turn, IC 208 generates a corresponding RF, IF or baseband signal, which is sent to connector module 206 by conductive pattern 220. Connector module 206 then forwards this signal to flexible cable 216.

In addition, phased array T/R module 100 provides shielding features. For instance, conductive patterns 244 and 242 may be grounded (or set to a DC voltage level) and coupled through micro vias 232 and 234. As described above, such ground or DC voltage levels may be provided through flexible cable 216.

Thus, phased array T/R module 100 provides an integrated and complex routing of signals (e.g., mm-wave, analog, digital and DC signals) without degrading mm-wave performance. More particularly, top layers of phased array T/R module 100 (e.g., substrate layer 202$_1$) are efficiently utilized by providing only antenna array elements 102$_1$-102$_9$. Multiple substrate layers with stacked metal patterns of antennas can be used to increase the antenna bandwidth and radiation efficiency. Other elements, such as IC 208, integrated passives, high-Q elements, DC logic, distribution layers, and so forth, may be positioned away from the antenna elements to promote unobstructed antenna patterns and less parasitics around the antenna elements. Accordingly, through such complex routing with controlled impedances and three-dimensional arrangements on its three-dimensional package architecture, phased array T/R module 100 may be advantageously implemented in a small package size.

Moreover, antenna elements 102$_1$ through 102$_9$ are unobstructed from any other integrated structures and ICs and the antenna array layout can utilize the whole top surface of phased array T/R module 100 (e.g., the surface of substrate layer 202$_1$) to enable size reductions. Multiple substrate layers can be utilized to create antenna patterns also.

Although FIGS. 1 and 2 show a particular arrangement of elements, embodiments may employ various arrangements of mm-wave antenna arrays. Further, other signal routes and/or routing techniques may be employed.

Figure 3:
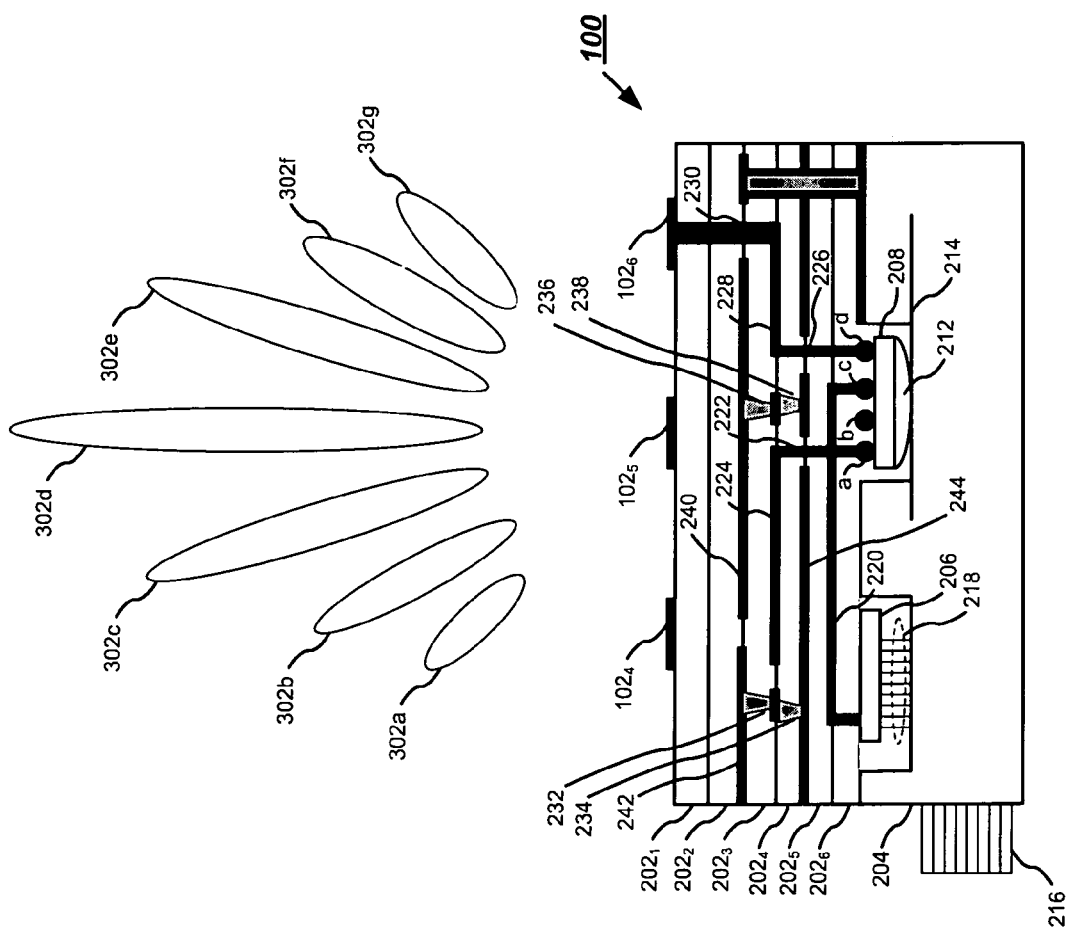
FIG. 3 is the view of FIG. 2 further showing an exemplary phased array beam pattern.

FIG. 3 is a further cross-sectional view of phased array T/R module 100. In particular, this drawing shows the view of FIG. 2, as well as an exemplary beam pattern. This beam shows a beam at positions 302a-302g. These positions are provided for illustration and not limitation. Accordingly, embodiments may provide other patterns. Each of positions 302a-302g is directed at a different elevation angle. This shows that (as a function of elevation angle) the beam's gain decreases quickly from its maximum.

Figure 4:
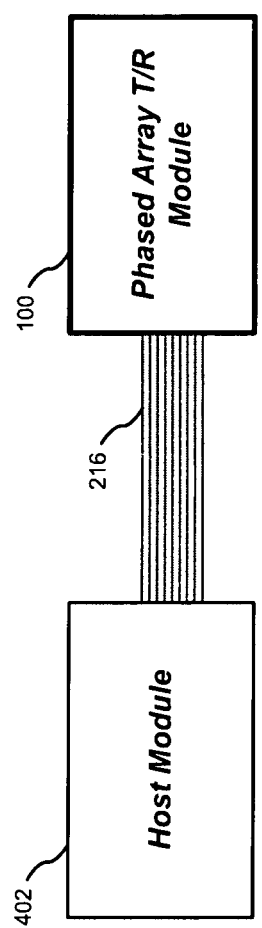
FIG. 4 is a diagram of an exemplary device implementation.

FIG. 4 is a diagram of an apparatus 400 that may employ phased array T/R module 100. This apparatus may be included in various devices, such as access points, portable devices, and so forth. As shown in FIG. 4, this device includes a host module 402 and phased array T/R module 100.

Host module 402 exchanges RF, IF or baseband signals with phased array T/R module 100. As shown in FIG. 4, this exchange may be through a cable 216 (e.g., a flexible cable). In turn, phased array T/R module 100 exchanges corresponding wireless signals (e.g., mm-wave signals) with remote devices.

The signals exchanged between host module 402 and phased array T/R module 100 may correspond to messages or information associated with one or more protocols, and/or with one or more user applications. Thus, host module 402 may perform operations corresponding to such protocol(s) and/or user application(s). Exemplary protocols include various link control, media access control, network, transport and/or session layer protocols. Exemplary user applications include telephony, messaging, e-mail, web browsing, content (e.g., video and audio) distribution/reception, and so forth. Embodiments, however, are not limited to these examples.

Host module 402 may be implemented in various ways. For example, host module 402 may comprise one or more processors and a storage medium (e.g., memory). In embodiments, the processor(s) may execute instructions contained in the storage medium. Exemplary processors include microprocessors and digital signal processors. However other types of processors may be employed The storage medium may comprise Further, host module 402 may include hardware (e.g., circuitry) to convert between digital signals and/or data and the signals exchanged with phased array T/R module 100.

The storage medium may be a tangible medium. Examples include any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

While various embodiments of the present invention have been described above, it should be understood that they have been presented by way of example only, and not in limitation. Accordingly, it will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

The invention claimed is:

1. An apparatus, comprising:
   a plurality of substrate layers,
   the plurality of substrate layers including a first substrate layer having one or more phased array elements;
   an integrated circuit adjacent to a second substrate layer to exchange one or more radio frequency (RF) signals with the one or more phased array elements; and
   an external connector module including at least one integrated socket contact to exchange one or more further signals with the integrated circuit, the one or more further signals corresponding to the one or more RF signals;
   a heat sink layer adjacent and abutting the second substrate layer, wherein the connection module is located in a first recess within the heat sink layer and wherein the integrated circuit is located in a second recess provided by the heat sink layer;

wherein the plurality of substrate layers includes the second substrate layer; and wherein the connector module is adjacent to the second substrate layer.

2. The apparatus of claim 1, wherein the plurality of substrate layers includes one or more substrate layers between the first substrate layer and the second substrate layer.

3. The apparatus of claim 1, further comprising a heat spreader element located within the heat sink layer, wherein the heat spreader element is positioned in alignment with the integrated circuit.

4. The apparatus of claim 1, wherein the integrated circuit is attached to the heat sink layer by a conductive paste material.

5. The apparatus of claim 1, wherein the one or more RF signals are each millimeter-wave signals.

6. The apparatus of claim 1, wherein the connector module is configured to receive a cable having one or more conductors, the cable to convey the further signal.

7. The apparatus of claim 1, further comprising a cable.

8. An apparatus, comprising a host module; and a phased array transmit and receive module wherein the phased array transmit and receive module includes:

a plurality of substrate layers, the plurality of substrate layers including a first substrate layer having one or more phased array elements, an integrated circuit to exchange one or more radio frequency (RF) signals with the one or more phased array elements, and an external connector module including at least one integrated socket contact to exchange one or more further signals with the integrated circuit, the one or more further signals corresponding to the one or more RF signals, a heat sink layer adjacent and abutting a second substrate layer, wherein the connection module is located in a first recess within the heat sink layer and wherein the integrated circuit is located in a second recess provided by the heat sink layer, wherein the host module is to exchange the further signals with the connector module through a cable, wherein the plurality of substrate layers includes a second substrate layer; and wherein the integrated circuit and the connector module are adjacent to the second layer.

9. The apparatus of claim 8, wherein the plurality of substrate layers includes one or more substrate layers between the first substrate layer and the second substrate layer.

10. The apparatus of claim 8, further comprising a heat spreader element located within the heat sink layer, wherein the heat spreader element is positioned in alignment with the integrated circuit.

11. The apparatus of claim 8, wherein the integrated circuit is attached to the heat sink layer by a conductive paste material.

12. The apparatus of claim 8, wherein the one or more RF signals are each millimeter-wave signals.

13. The apparatus of claim 8, further comprising the cable.

14. The apparatus of claim 8, wherein the cable is a flexible cable.

15. The apparatus of claim 8, wherein the one or more further signals includes an intermediate frequency (IF) signal.

16. The apparatus of claim 8, wherein the one or more further signals includes a baseband signal.

* * * * *